(12) United States Patent  
Shimizu et al.

(10) Patent No.: US 11,901,702 B2  
(45) Date of Patent: *Feb. 13, 2024

(54) LED DBR STRUCTURE WITH REDUCED PHOTODEGRADATION

(71) Applicant: Lumileds LLC, San Jose, CA (US)

(72) Inventors: Ken Shimizu, Sunnyvale, CA (US); Hisashi Masui, San Jose, CA (US); Ted Wangensteen, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 866 days.

This patent is subject to a terminal disclaimer.

(21) Appl. No.: 16/945,101

(22) Filed: Jul. 31, 2020

(65) Prior Publication Data

US 2020/0412098 A1 Dec. 31, 2020

Related U.S. Application Data

(63) Continuation of application No. PCT/US2020/039962, filed on Jun. 26, 2020, which  
(Continued)

(51) Int. Cl.  
*H01S 5/22* (2006.01)  
*H01S 5/183* (2006.01)

(52) U.S. Cl.  
CPC .......... *H01S 5/222* (2013.01); *H01S 5/18341* (2013.01); *H01S 5/18361* (2013.01); *G02F 2201/346* (2013.01)

(58) Field of Classification Search  
None  
See application file for complete search history.

(56) References Cited

U.S. PATENT DOCUMENTS 7,830,937 B2 11/2010 Kushibe et al.  
7,901,870 B1 3/2011 Wach  
(Continued)

FOREIGN PATENT DOCUMENTS

JP 2006286758 A 10/2006  
JP 2007087994 A 4/2007  
(Continued)

OTHER PUBLICATIONS

From the EPO as the ISA, Notification of Transmittal of the International Search Report and the Written Opinion of the International Searching Authority corresponding to PCT/US2020/039962 dated Oct. 19, 2020, 14 pages.  
(Continued)

*Primary Examiner* — Tuan N Nguyen

(57) ABSTRACT

A distributed Bragg reflector (DBR) structure on a substrate includes a high refractive index layer comprising titanium oxide ($TiO_2$) and a low refractive index layer having a high carbon region and at least one low carbon region that contacts the high refractive index layer. Multiple layers of the high refractive index layer and the low refractive index layer are stacked. Typically, the multiple layers of the high refractive index layer and the low refractive index layer are stacked to a thickness of less than 10 microns. Each of the respective layers of the high refractive index layer and the low refractive index layer have a thickness of less than 0.2 microns.

20 Claims, 7 Drawing Sheets

Related U.S. Application Data is a continuation of application No. 16/455,051, filed on Jun. 27, 2019, now Pat. No. 10,886,703.

(56) References Cited

U.S. PATENT DOCUMENTS

| | | | |
|---|---|---|---|
| 9,705,044 B2 | 7/2017 | Sasaki | |
| 10,886,703 B1 | 1/2021 | Shimizu | |
| 2008/0157181 A1 | 7/2008 | Kim et al. | |
| 2011/0164308 A1* | 7/2011 | Arsenault | G02F 1/0128 359/322 |
| 2013/0209780 A1* | 8/2013 | Poxson | C23C 16/487 204/192.1 |
| 2015/0340567 A1 | 11/2015 | Ichikawa | |

FOREIGN PATENT DOCUMENTS

| | | |
|---|---|---|
| JP | 2015072992 A | 4/2015 |
| KR | 10-1996-0006167 A | 2/1996 |
| WO | 2014122709 A1 | 8/2014 |
| WO | 2019/027952 A1 | 2/2019 |

OTHER PUBLICATIONS

Gerry Triani, et al., "Atomic Layer Deposition of $TiO_2/Al_2O_3$ Films for Optical Applications", Proceedings of SPIE, vol. 5870, Aug. 18, 2005, p. 587009, XP055270341, US.

* cited by examiner

LED DBR STRUCTURE WITH REDUCED PHOTODEGRADATION

CROSS REFERENCE TO RELATED APPLICATIONS

This application is a continuation of International Patent Application PCT/US2020/039962 filed Jun. 26, 2020, which claims priority to U.S. patent application Ser. No. 16/455,051 filed Jun. 27, 2019, both of which are incorporated herein by reference in their entirety.

TECHNICAL FIELD

The present disclosure generally relates to structure and manufacture of distributed Bragg reflectors (DBR), particularly to DBRs in LED packages. A particular set of low carbon precursors are used to improve reflector quality.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths. LEDs may be combined with one or more wavelength converting materials (generally referred to herein as "phosphors") that absorb light emitted by the LED and in response emit light of a longer wavelength. Such devices may be referred to as phosphor-converted LEDs ("pcLEDs").

Manufacturing LEDs with light reflective sidewalls capable of redirecting light to improve useful light extraction efficiency is common. For example, a sidewall can be coated with various combinations of binder and reflective particles. One often used reflector is based on a silicone binder loaded with TiO2 nanoparticles. Unfortunately, due to particle size and light interaction, such reflective coatings can still result in excess stray light that is absorbed within the coating or redirected into a direction that results in absorption.

Sidewalls and substrates can also be coated with reflective metals. While reflectivity can be improved as compared TiO2 nanoparticles, manufacturing difficulties are increased and potential for damage due to the introduction of relatively large amounts of metal into the LED packaging limits widespread use of metal reflectors.

A better reflector is provided by a non-metallic distributed Bragg reflector (DBR). Atomic layer deposition can be used to create multiple layers of precise thickness and of alternating low and high refractive index materials. One common multilayer stack is based on low refractive index alumina ($Al_2O_3$) and high refractive index titanium oxide ($TiO_2$). These layers are compatible with both conventional LED processing temperatures and typical ALD processing temperatures of 180° C. As an additional advantage, various organometallic or halide precursors are usable, including Trimethyl Aluminum for $Al_2O_3$ and $TiCL_4/H_2O$ for $TiO_2$ layer formation.

Unfortunately, amorphous layers of $TiO_2$ created by such ALD processes are photocatalytic. In the presence of blue light generated by an LED and heat, the TiO2 layer can react with carbon contamination from organometallic precursors to create graphite. Over time this leads to significant absorption losses in the LED device. To minimize this damage, non-carbon precursors and low carbon film manufacture techniques to reduce the carbon content are needed.

SUMMARY

In accordance with embodiments of the invention, a DBR structure on a substrate includes a high refractive index layer comprising titanium oxide (TiO2) and a low refractive index layer having a high carbon region and at least one low carbon region that contacts the high refractive index layer. Multiple layers of the high refractive index layer and the low refractive index layer are stacked. Typically, the multiple layers of the high refractive index layer and the low refractive index layer are stacked to a thickness of less than 10 microns. For example, two pixels in an LED array may be separated by a sidewall with a DBR structure of thickness less than 10 microns, comprising the multiple layers of the high refractive index layer and the low refractive index layer. Each of the respective layers of the high refractive index layer and the low refractive index layer can have a thickness of less than 0.2 microns.

In one embodiment, the low refractive index layer includes $Al_2O_3$, which can be formed from an organometallic precursor such as Trimethyl Aluminum. The carbon is precursor results in the high carbon region of the low refractive index layer.

The contacting low carbon region of the low refractive index layer can include $Al_2O_3$ formed from a halide precursor such as $AlCl_3$. Use of a precursor that does not contain carbon results in the low carbon region of the low refractive index layer.

In some embodiments the substrate is sapphire, but it can alternatively be a semiconductor material such as GaN, glass or dielectric structures, or silicon carbide.

In one embodiment, an ALD process for forming a DBR structure on a substrate includes the steps of depositing a first low refractive index layer having a high carbon region; depositing a first low refractive index layer with a low carbon region that contacts the high carbon region; depositing a high refractive index layer comprising titanium oxide ($TiO_2$) that contacts the low carbon region of the first low refractive index layer; depositing a second low refractive index layer with a low carbon region that contacts the high refractive index layer; and depositing a second low refractive index layer having a high carbon region.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
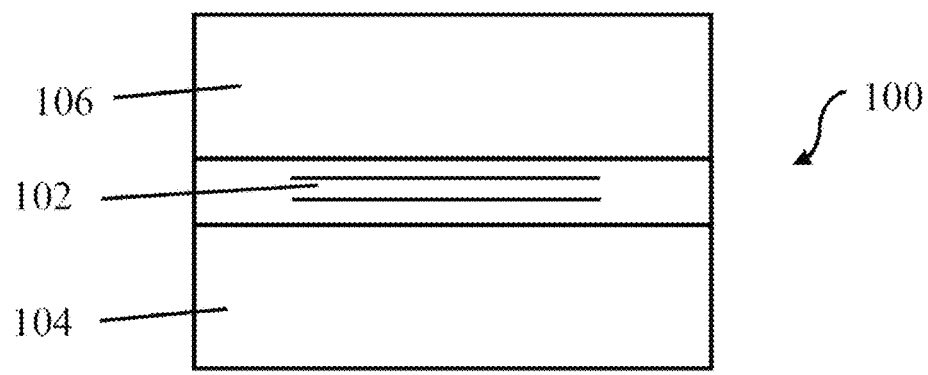
FIG. 1 shows a schematic cross-sectional view of an example pcLED.

FIG. 1 shows an example of an individual pcLED 100 comprising a semiconductor diode structure 102 (an LED) disposed on a substrate 104, and a phosphor layer or structure 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
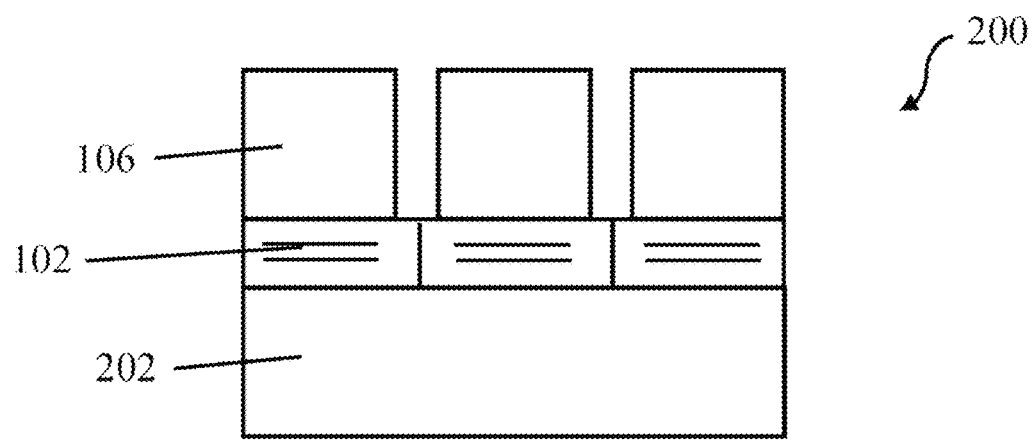
FIGS. 2A and 2B show, respectively, cross-sectional and top schematic views of an array of pcLEDs.
Figure 2B:
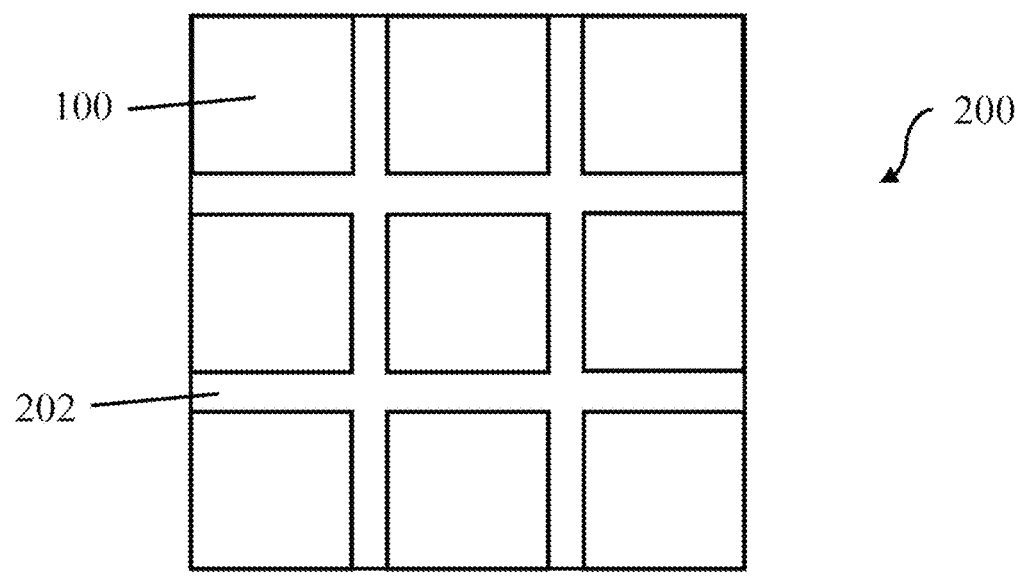

FIGS. 2A-2B show, respectively, cross-sectional and top views of an array 200 of pcLEDs 100 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable material.

Figure 3A:
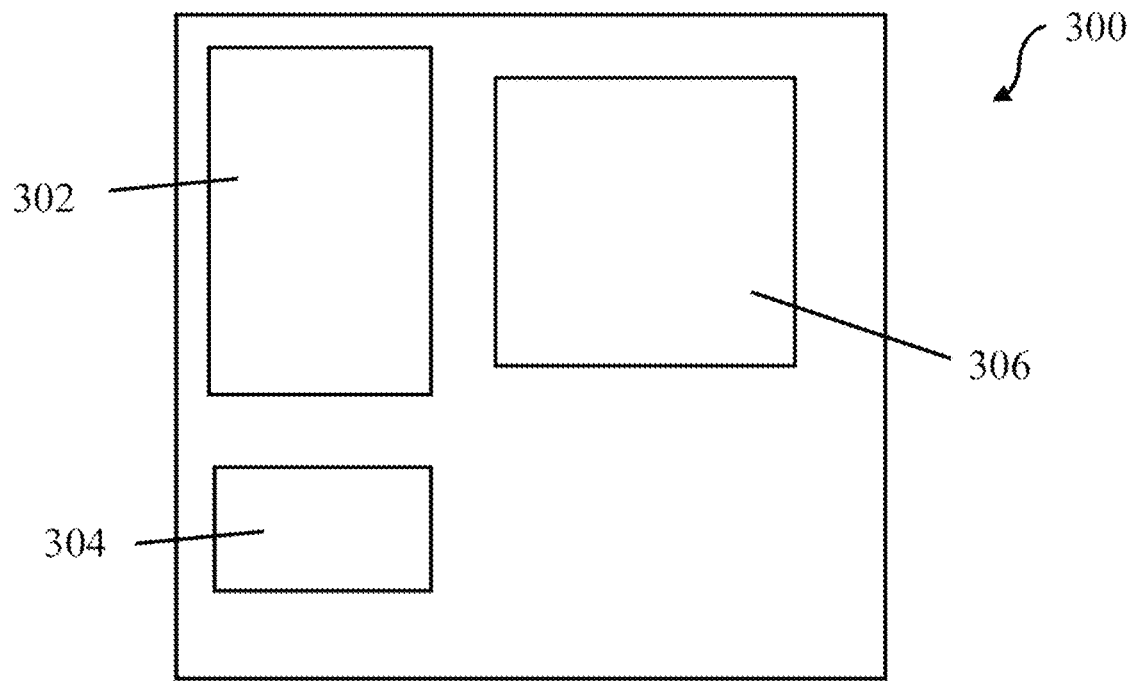
FIG. 3A shows a schematic top view of an electronics board on which an array of pcLEDs may be mounted, and FIG. 3B similarly shows an array of pcLEDs mounted on the electronic board of FIG. 3A.
Figure 3B:
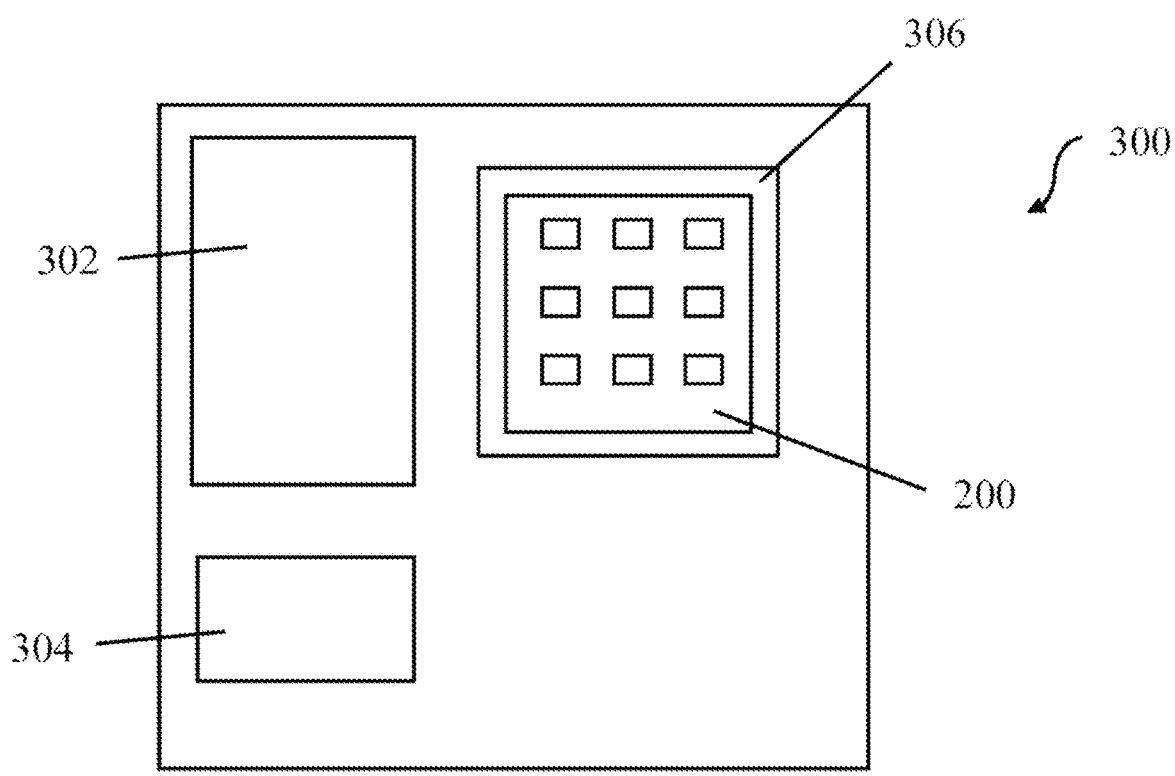

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
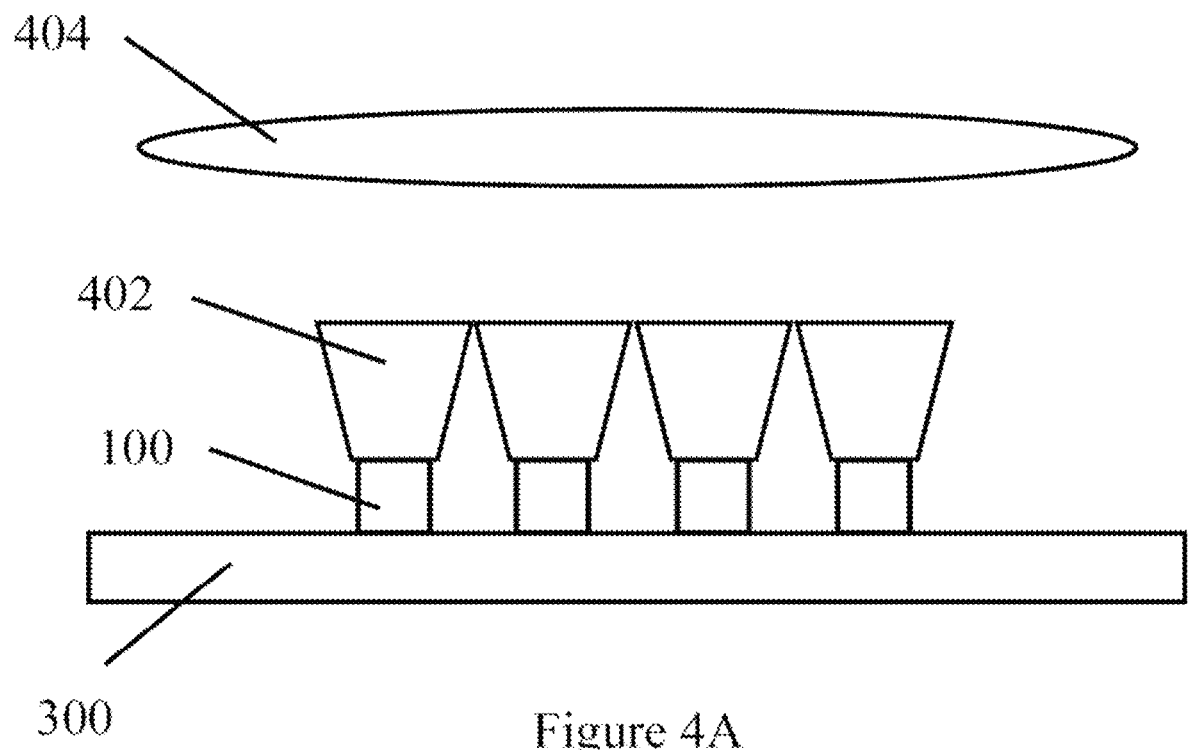
FIG. 4A shows a schematic cross-sectional view of an array of pcLEDs arranged with respect to waveguides and a projection lens.
Figure 4B:
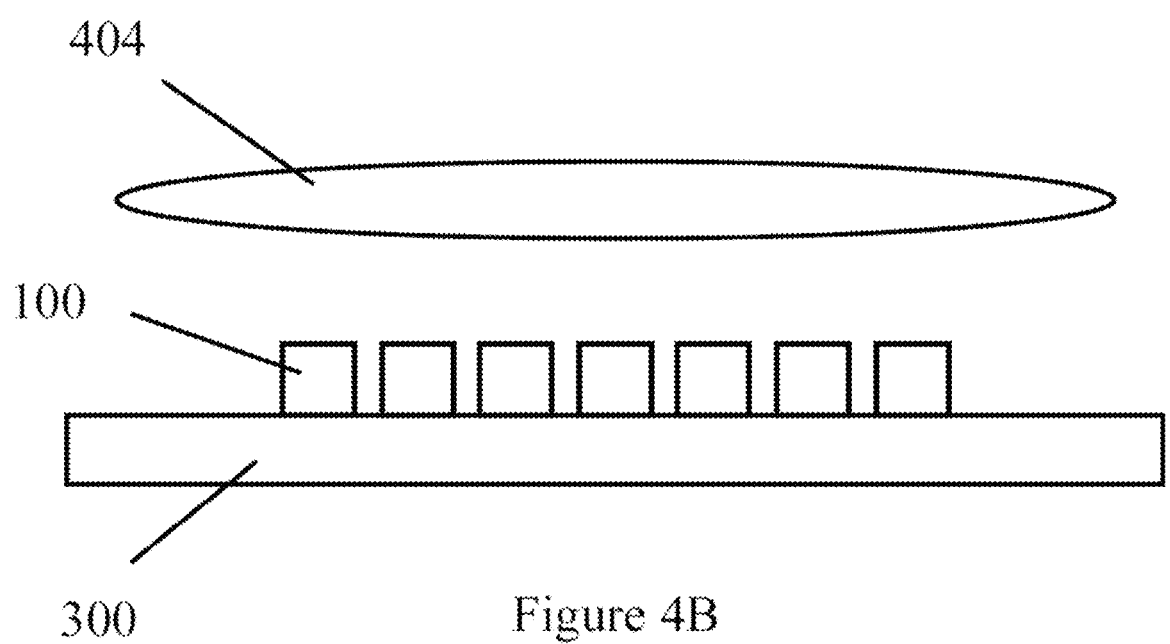
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

Referring again to FIGS. 2A-2B, although these figures show a three by three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape.

Figure 2C:
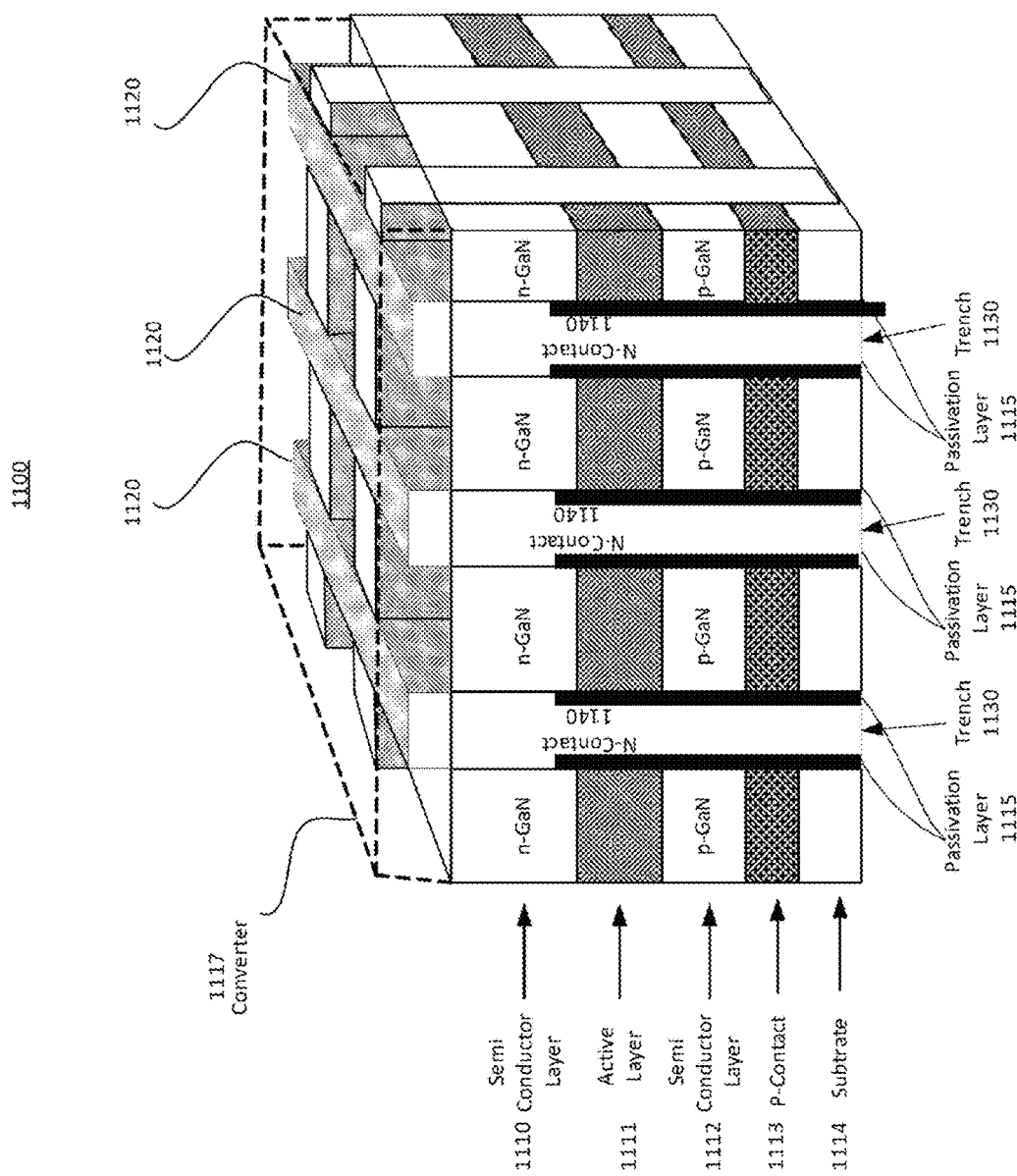
FIG. 2C shows a perspective view of a monolithic array of pcLEDs.

LEDs having dimensions in the plane of the array (e.g., side lengths) of less than or equal to about 50 microns are typically referred to as microLEDs, and an array of such microLEDs may be referred to as a microLED array An array of LEDs, or portions of such an array, may be formed as a segmented monolithic structure in which individual LED pixels are electrically isolated from each other by trenches and or insulating material. FIG. 2C shows a perspective view of an example of such a segmented monolithic array 1100. Pixels in this array are separated by trenches 1130 which are filled to form n-contacts 1140. The monolithic structure is grown or disposed on a substrate 1114. Each pixel includes a p-contact 1113, a p-GaN semiconductor layer 1112, an active region 1111, and an n-GaN semiconductor layer 1110. A wavelength converter material 1117 may be deposited on the semiconductor layer 1110 (or other applicable layer). Passivation layers 1115 may be formed within the trenches 1130 to separate at least a portion of the n-contacts 1140 from one or more layers of the semiconductor. The n-contacts 1140, or other material within the trenches, may extend into the converter material 1117 such that the n-contacts 1140 or other material provide complete or partial optical isolation 1120 between the pixels.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 5:
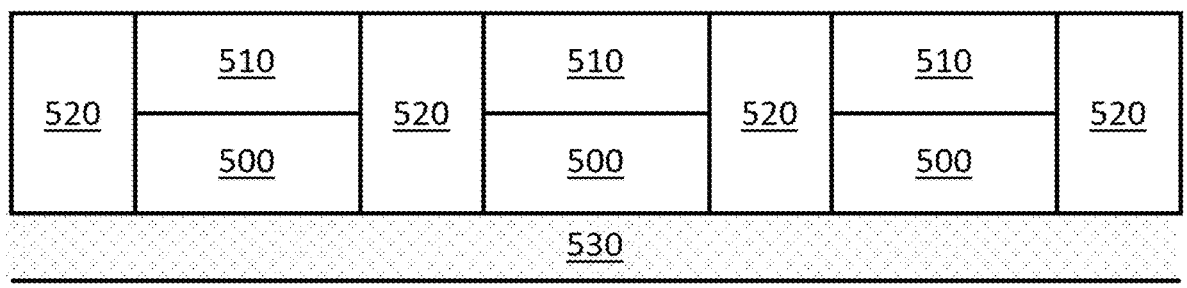
FIG. 5 shows a schematic cross-sectional view of an example array of pcLEDs.

FIG. 5 shows an example of an LED array with a semiconductor diode structure 500 (an LED) disposed on a substrate 530, and a phosphor layer or structure 510 disposed on the LED. Each semiconductor diode structure 500 is an individual LED, or pixel, separated from other pixels by a reflector or sidewall 520. The sidewalls 520 may reflect light from the semiconductor diode structure 500 upwards into the phosphor layer 510, and may reflect light converted by the phosphor layer 510 upwards so that it may be emitted out to be seen by a viewer. The sidewalls 520 may be DBRs sidewalls. Reflectors may also be disposed below the semiconductor diode structure, such as to prevent back-scattered light from being lost in the device through absorption or misdirected emission. For example, substrate 530 may be a reflector or coated with a reflector, where the reflector is a DBR. That is, DBR reflectors or sidewalls within a pixel or LED array need not be restricted to the left and right side of a semiconductor diode structure 500, but may be disposed above or below the semiconductor diode structure 500 depending on the desired output. DBR reflectors in LED arrays may be similar or the same as the reflectors described below.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas.

Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Typically, the above applications for LEDs, arrays of LEDs, pcLEDs, and arrays of pcLEDs benefit from improved efficiency of light generation in and light extraction from the LED. These applications typically also benefit from greater control of the direction in which light is radiated from the active region, and of the direction from which light is extracted from the LED. These benefits typically accrue whether or not the device comprises a wavelength converting structure.

Figure 6:
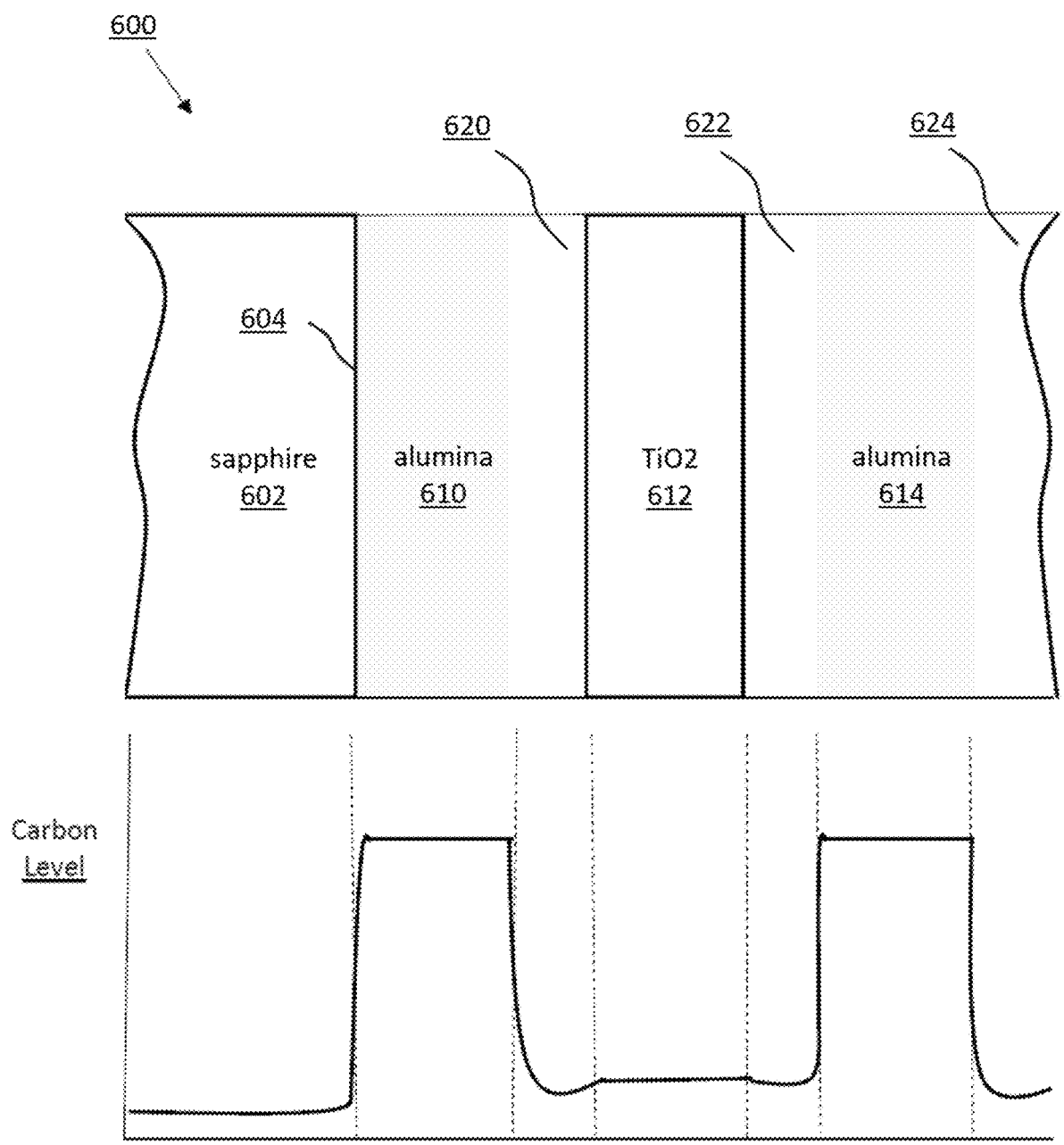
FIG. 6 illustrates one embodiment of a LED substrate sidewall with an attached high reliability distributed Bragg reflector.

FIG. 6 illustrates one embodiment of a LED substrate sidewall 600 with an attached high reliability distributed Bragg reflector. As illustrated, a sapphire substrate 602 has an attached DBR sidewall formed from alternating low and high refractive index layers. Other substrates can also be used, including semiconductor, silicon carbide, glass, or other dielectric substrates that can benefit from attachment of DBR mirrors.

FIG. 6 also shows a first low refractive index layer 610 having a high carbon region attached to sapphire substrate 602. The high carbon region is present because organometallic precursors are used in manufacture. In one embodiment, the low refractive index layer 610 having a high carbon region is alumina ($Al_2O_3$), created using Trimethyl Aluminum as a precursor. Alternatively, $SiO_2$ formed with an organometallic precursor can be used. A first low refractive index layer with a low carbon region 620 contacts the high carbon region of the low refractive index layer 610. For example, the low carbon region 620 has a lower carbon content than the high carbon region. In one embodiment, the low refractive index layer with low carbon region 620 can be formed from aluminum halide precursors such as $AlCl_3$. This low refractive index layer with low carbon layer 620 in turn contacts a high refractive index layer 612 comprising titanium oxide ($TiO_2$). A second low refractive index layer with a low carbon region 622 contacts the high refractive index layer 612, followed by a second low refractive index layer having a high carbon region 614 (e.g. another alumina layer), and another low refractive index layer with low carbon layer 624. This pattern of alternating low and high refractive layers (e.g. $Al_2O_3$ or $SiO_2$ alternating with $TiO_2$) can be repeated multiple times, with carbon mediated degradation being prevented by separating the high carbon low refraction index layers from the high refractive index layers using intermediary low refractive index and low carbon layers. This is illustrated by the associated carbon level graph showing relative carbon amounts in the various described layers.

In some embodiments $TiCl_4$ (or other Ti-halides) and $H_2O$ are precursors for $TiO_2$ layer formation. $AlCl_3$ (or other Al-halides) and $H_2O$ within the $TiO_2$ layer can be used to form thin (1 nm) $Al_2O_3$ with reduced crystallization propensity in the $TiO_2$ layer. Typically, the resultant DBR is a 3~5 um multilayer stack of high ($TiO_2$) and low ($Al_2O_3$) refractive index layers formed using conventional ALD processing. The ALD can be operated at 180° C. and the pulses of $TiCl_4$, $H_2O$ (or Ozone), and $AlCl_3$, $H_2O$ and TMA, $H_2O$ can be sequentially released into the chamber to generate single atomic layers one by one. The LEDs (including substrate, semiconductor die, and phosphor platelets) can be held in place by tape carriers while an ALD chamber is heated to 150~200° C. At these temperatures the $TiO_2$ will crystallize without a substitutional layer of $AlCl_3$ (or other heterogeneous oxide) to form an alloy-like structure an ensuring an amorphous film. Carbon entrapment is eliminated by use of non-carbon precursors for layers deposited near or next to the $TiO_2$ layer.

The above-described alternating layers are important because $Al_2O_3$ layers grown completely with $AlCl_3$ without any high carbon regions of $Al_2O_3$ grown with Trimethyl Aluminum were observed to cracks and delaminate. That is, contiguous $Al_2O_3$ layers grown with $AlCl_3$ that are low carbon throughout experience the downsides of high stress. The embodiments of the present invention balance the high stress of low carbon regions with high carbon regions of alumina, while balancing the degradation caused by high carbon regions of alumina with the low to no degradation of the low carbon regions.

Figure 7:
FIG. 7 illustrates improved performance during high temperature operating life (HTOL) testing.
Figure 7:
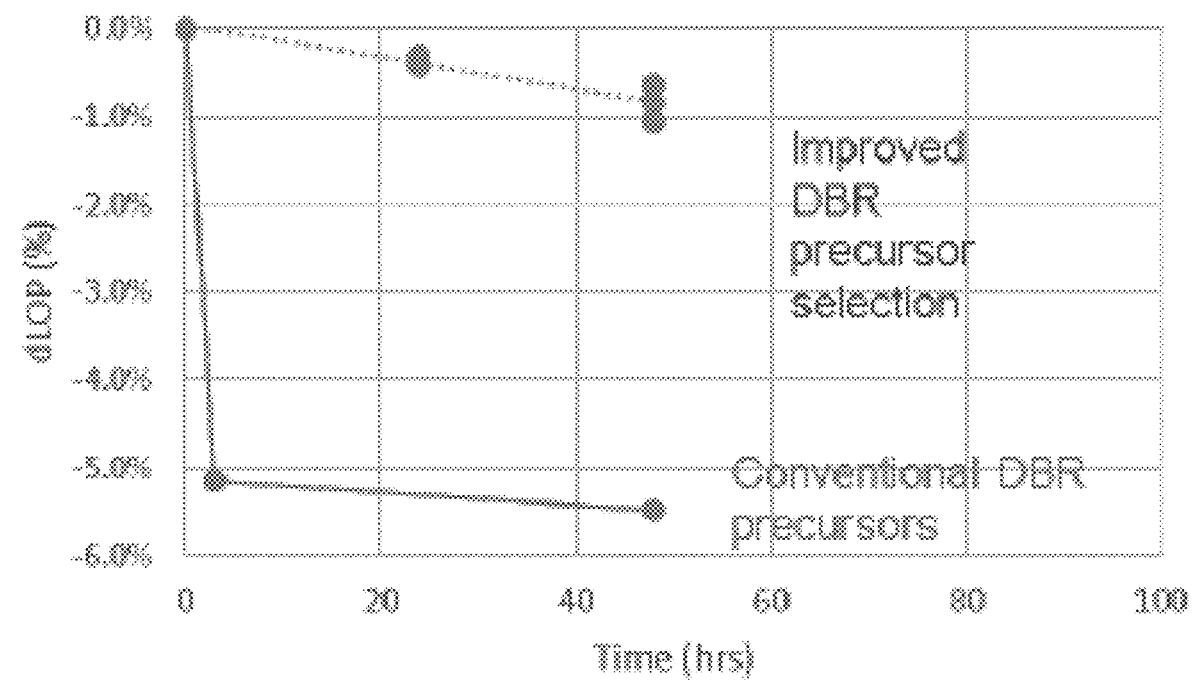

FIG. 7 illustrates improved performance during high temperature operating life (HTOL) testing. As is apparent from the graph, LEDs formed from the improved low carbon DBR precursors have a much lower failure rate than LEDs having sidewalls formed from conventional organometallic DBR precursors.

Light emitting pixel arrays (i.e. addressable LED segments) may particularly benefit from the described low carbon ALD DBR sidewall coatings. As compared to bulky silicone binder and TiO2 nanoparticle sidewalls, ALD DBR sidewalls improve efficiency, greatly reduce between pixel cross talk that can interfere with precise light projection and can be extremely thin (e.g. less than 10 microns), allowing usage in close packed light emitting pixel arrays.

Light emitting pixel arrays with the described improved DBR sidewalls may support applications that benefit from low crosstalk, fine-grained intensity, improved spatial and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays with improved DBR sidewalls include camera flashes, automotive headlights, architectural and area illumination, street lighting, and informational displays.

A light emitting pixel array with improved DBR sidewalls may be well suited for camera flash applications for mobile devices. Typically, an intense brief flash of light from a high intensity LED is used to support image capture. Unfortunately, with conventional LED flashes, much of the light is wasted on illumination of areas that are already well lit or do not otherwise need to be illuminated. Use of a light emitting pixel array may provide controlled illumination of portions of a scene for a determined amount of time. This may allow the camera flash to, for example, illuminate only those areas imaged during rolling shutter capture, provide even lighting that minimizes signal to noise ratios across a captured image and minimizes shadows on or across a person or target subject, and/or provide high contrast lighting that accentuates shadows. If pixels of the light emitting pixel array are spectrally distinct, color temperature of the flash lighting may be dynamically adjusted to provide wanted color tones or warmth.

Automotive headlights that actively illuminate only selected sections of a roadway are also supported by light emitting pixel arrays with improved DBR sidewalls. Using infrared cameras as sensors, light emitting pixel arrays activate only those pixels needed to illuminate the roadway while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Architectural and area illumination may also benefit from light emitting pixel arrays with improved DBR sidewalls. Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays with improved DBR sidewalls. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays with improved DBR sidewalls are also well suited for supporting applications requiring direct or projected displays. For example, warning, emergency, or informational signs may all be displayed or projected using light emitting arrays. This allows, for example, color changing or flashing exit signs to be projected. If a light emitting array with improved DBR sidewalls is composed of a large number of pixels, textual or numerical information may be presented. Directional arrows or similar indicators may also be provided.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A light emitting diode (LED) device comprising:
a substrate;
a semiconductor diode structure on the substrate and comprising a first light output surface oppositely positioned from the substrate; and
a DBR structure on the substrate, the DBR structure comprising:
a high refractive index layer comprising titanium oxide (TiO2); and
a low refractive index layer having a high carbon region and at least one low carbon region that contacts the high refractive index layer.

2. The LED device of claim 1, further comprising a wavelength converting layer on the semiconductor diode structure comprising a second light output surface oppositely positioned from the first light output surface of the semiconductor diode structure.

3. The LED device of claim 2, further comprising sidewalls adjacent to the semiconductor structure and comprising the DBR structure,
wherein the DBR structure is arranged to reflect light emitted by at least one of the semiconductor diode structure and the wavelength converting layer in a first direction away from the substrate.

4. The LED device of claim 3, wherein the substrate comprises a second DBR structure, the second DBR structure comprising:
a second high refractive index layer comprising titanium oxide (TiO2); and
a second low refractive index layer having a second high carbon region and a second low carbon region that contacts the second high refractive index layer.

5. The LED device of claim 1, wherein the LED device has a width less than or equal to 50 microns.

6. The LED device of claim 1, wherein multiple layers of the high refractive index layer and the low refractive index layer are stacked to a thickness of less than 10 microns, and each of the respective layers of the high refractive index layer and the low refractive index layer have a thickness of less than 0.2 microns.

7. The LED device of claim 1, wherein the low refractive index layer further comprises at least one of Al2O3 and SiO2, and the high carbon region of the low refractive index layer further comprises Al2O3 formed from an organometallic precursor.

8. The LED device of claim 1, wherein high refractive index layer is between the low refractive index layer and a second low refractive index layer, between the at least one low carbon region of the low refractive index layer and a second low carbon region of the second low refractive index layer, and in direct contact with the second low carbon region.

9. The LED device of claim 1, wherein the at least one low carbon region comprises two low carbon regions that are on opposite sides of the low refractive index layer.

10. The LED device of claim 1, wherein both the high carbon region and the low carbon region comprise a same chemical compound.

11. A light emitting diode (LED) array comprising:
a substrate;
a plurality of LEDs, each of the LEDs comprising:
a semiconductor diode structure on the substrate and comprising a first light output surface oppositely positioned from the substrate;
one or more DBR structures on the substrate, the one or more DBR structures comprising:
a high refractive index layer comprising titanium oxide (TiO2); and
a low refractive index layer having a high carbon region and at least one low carbon region that contacts the high refractive index layer.

12. The LED array of claim 11, further comprising a wavelength converting layer on the semiconductor diode structure comprising a second light output surface oppositely positioned from the first light output surface of the semiconductor diode structure.

13. The LED array of claim 12, further comprising sidewalls adjacent to the semiconductor structure, between the LEDs, and comprising the DBR structure;
wherein the DBR structure is arranged to reflect light emitted by at least one of the semiconductor diode structure and the wavelength converting layer in a first direction away from the substrate.

14. The LED array of claim 11, wherein the substrate comprises a second DBR structure, the second DBR structure comprising:
a second high refractive index layer comprising titanium oxide (TiO2); and
a second low refractive index layer having a second high carbon region and a second low carbon region that contacts the second high refractive index layer.

15. The LED array of claim 11, wherein each of the LEDs has a width less than or equal to 50 microns, and are spaced apart from each other by lanes of less than or equal to 10 microns.

16. The LED array of claim 11, wherein multiple layers of the high refractive index layer and the low refractive index layer are stacked to a thickness of less than 10 microns, and each of the respective layers of the high refractive index layer and the low refractive index layer have a thickness of less than 0.2 microns.

17. The LED array of claim 11 wherein the low refractive index layer further comprises at least one of Al2O3 and SiO2, and the high carbon region of the low refractive index layer further comprises Al2O3 formed from an organometallic precursor.

18. The LED array of claim 11, wherein high refractive index layer is between the low refractive index layer and a second low refractive index layer, between the at least one low carbon region of the low refractive index layer and a second low carbon region of the second low refractive index layer, and in direct contact with the second low carbon region.

19. The LED array of claim 11, wherein each of the plurality of LEDs is an individually addressable pixel and the LED array is monolithic.

20. A light emitting diode (LED) device comprising:
a substrate comprising sapphire;
a semiconductor diode structure on the substrate and comprising a first light output surface oppositely positioned from the substrate;
a DBR structure on the substrate adjacent to the semiconductor diode structure, the DBR structure comprising:
a high refractive index layer comprising titanium oxide (TiO2); and a low refractive index layer having a high carbon region and at least one low carbon region that contacts the high refractive index layer, the high carbon region formed from a different precursor than the low carbon region, the high carbon region and the low carbon region comprising a same chemical compound.

\* \* \* \* \*